(12) United States Patent
Suzuki

(10) Patent No.: US 7,079,196 B2
(45) Date of Patent: Jul. 18, 2006

(54) TELEVISION TUNER WHICH OPERATES AT LOW VOLTAGE

(75) Inventor: Takeo Suzuki, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 542 days.

(21) Appl. No.: 10/627,421

(22) Filed: Jul. 25, 2003

(65) Prior Publication Data

US 2004/0070693 A1    Apr. 15, 2004

(30) Foreign Application Priority Data

Aug. 7, 2002    (JP)    ............................. 2002-230443

(51) Int. Cl.
*H04N 5/50*    (2006.01)

(52) U.S. Cl. ...................................... 348/731; 348/733

(58) Field of Classification Search ........ 348/731–733, 348/725; 455/182.3, 182.1, 188.1, 191.1, 455/191.3, 192.3, 192.1; 334/47, 48, 71, 334/78; H04N 5/50, 5/44
See application file for complete search history.

(56) References Cited

U.S. PATENT DOCUMENTS

| 6,351,294 B1 * | 2/2002 | Yamamoto et al. | ......... 348/731 |
| 6,573,949 B1 * | 6/2003 | Yamamoto | ................... 348/731 |
| 6,822,697 B1 * | 11/2004 | Osada | ......................... 348/731 |

FOREIGN PATENT DOCUMENTS

JP          06-319087        11/1994

* cited by examiner

*Primary Examiner*—Sherrie Hsia
(74) *Attorney, Agent, or Firm*—Brinks Hofer Gilson & Lione

(57) ABSTRACT

A television tuner has a high frequency tuning circuit, a high frequency amplifier, a mixer, and an oscillating section. The tuning circuit is made up of an inductor and plural capacitors and at least one of the capacitors is selected and connected in parallel with the inductor; and the oscillating section has at least plural oscillators which are included in an integrated circuit. In the integrated circuit, the oscillators respectively have variable capacitors to vary a frequency of a local oscillation signal. Groups into which a receiving frequency band is divided correspond to the oscillators on the basis of one oscillator per group; and each of the oscillators generates local oscillation frequencies depending on television signals in the corresponding group.

6 Claims, 3 Drawing Sheets

| f | C0 | C1 | C2 | C3 |
|---|----|----|----|----|
| f0 | 1 | 0 | 0 | 0 |
| f1 | 1 | 1 | 0 | 0 |
| f2 | 1 | 0 | 1 | 0 |
| f3 | 1 | 1 | 1 | 0 |
| f4 | 1 | 0 | 0 | 1 |
| f5 | 1 | 1 | 0 | 1 |
| f6 | 1 | 0 | 1 | 1 |
| f7 | 1 | 1 | 1 | 1 |

TELEVISION TUNER WHICH OPERATES AT LOW VOLTAGE

BACKGROUND OF THE INVENTION

1. Field of the Invention

The present invention relates to a television tuner, and more particularly to a television tuner which can receive signals without high voltage applied to variable capacitors and uses an integrated circuit to simplify the structure.

2. Description of the Related Art

The standard structure of a conventional television tuner is as illustrated in FIG. 4: an input tuning circuit 31, a high frequency amplifier 32, an interstage tuning circuit 33, a mixer 34, an oscillator 35 for supplying a local oscillation signal to the mixer 34, a PLL circuit 36 for applying tuning voltage to the input tuning circuit 31, interstage tuning circuit 33 and oscillator 35, and a DC-DC converter 37 for supplying high voltage (30 V or so) to the PLL circuit 36 are connected in cascade.

The input tuning circuit 31 is made up of a single tuning circuit which incorporates an inductor 31a and a varactor diode 31b. According to tuning voltage TU (from approx. 2 V to 27 V) applied to the varactor diode 31b, tuning is done to a television signal from a channel to be received. As the tuning voltage varies in the above range, the capacitance value varies from approx. 2 pF (picofarads) to 20 pF. The high frequency amplifier 32 amplifies the tuned television signal. The interstage tuning circuit 33 is a double tuning circuit which is composed of a primary tuning circuit having an inductor 33a and a varactor diode 33b and a secondary tuning circuit having an inductor 33c and a varactor diode 33d. The same tuning voltage TU is applied to the varactor diodes 33b and 33d in the interstage tuning circuit 33 so that tuning is done to a television signal from a channel.

The television signal selected by the interstage tuning circuit 33 enters the mixer 34 where it is mixed with a local oscillation signal and converted into an intermediate frequency signal. Hence, the local oscillation frequency follows the tuning frequencies of the tuning circuits 31 and 33 in a way to stay higher than them by just as much as the frequency of the intermediate frequency signal. This is what is called "tracking." The oscillator 35 which supplies a local oscillation signal has a resonant circuit which incorporates an inductor 35a and a varactor diode 35b. The characteristics of this varactor diode 35b are the same as those of the varactor diode 31b of the input tuning circuit 31 and the varactor diodes 33b and 33d of the interstage tuning circuit 33. The same tuning voltage TU is applied to the varactor diode 35b.

The PLL circuit 36 which supplies the tuning voltage requires high voltage (30 V). This high voltage is supplied from the DC-DC converter 37. The PLL circuit 36 and the DC-DC converter 37 are included in an integrated circuit 38. The DC-DC converter 37 boosts the supply voltage B (5 V or so) applied to the integrated circuit 38 by double rectification and supplies it to the PLL circuit 36. The PLL circuit 36 generates a tuning voltage TU which ranges from approx. 2 V to 27 V, according to input channel selection data.

However, when a required high voltage as a tuning voltage is generated by the DC-DC converter, the withstand voltage for the integrated circuit as a restrictive factor must be taken into consideration. In addition, recently there has been a tendency to use low supply voltages for television tuners and their integrated circuits. Under these circumstances, it is becoming more and more difficult for a DC-DC converter to generate a high tuning voltage.

One possible solution to this problem is to use varactor diodes whose capacitance largely varies even at low voltage. However, this type of varactor diode has a problem: it is likely to cause distortion due to a strong electric field caused by a TV signal.

SUMMARY OF THE INVENTION

The present invention has been made in view of the above circumstances and provides a simplified television tuner that operates at low voltage without using varactor diodes (which require high voltage) and a DC-DC converter (which generates high voltage) and uses an integrated circuit which incorporates variable capacitors.

In order to solve the above problem, according to one aspect of the present invention, the television tuner comprises: a tuning circuit which tunes with a television signal within a prescribed receiving frequency band; a high frequency amplifier which amplifies the television signal; a mixer which converts the television signal into an intermediate frequency signal; and an oscillating section which supplies a local oscillation signal to the mixer. The tuning circuit has an inductor and plural capacitors; at least one of the capacitors is selected and connected in parallel with the inductor; the oscillating section has at least plural oscillators which are included in an integrated circuit; in the integrated circuit, each of the oscillators has a variable capacitor to vary a frequency of the local oscillation signal; groups into which the receiving frequency band is divided correspond to the oscillators on the basis of one oscillator per group; and each of the oscillators generates local oscillation frequencies depending on television signals in the corresponding group.

According to another aspect of the invention, the integrated circuit includes the plural capacitors and switches to select the capacitors; the inductor is located outside the integrated circuit; and the integrated circuit has a terminal to connect the inductor with the capacitors.

According to another aspect of the invention, the capacitors comprise a primary capacitor connected with the inductor and plural secondary capacitors which are selected by the switches and connected with the inductor.

According to another aspect of the invention, a capacitance value of each of a second to Nth ones of the secondary capacitors is (2N−1) times as large as the capacitance value of the first one of the secondary capacitors.

According to another aspect of the invention, the high frequency amplifier and the mixer are included in the integrated circuit.

According to another aspect of the invention, the tuning circuit comprises an input tuning circuit and an interstage tuning circuit; the input tuning circuit is located before the high frequency amplifier; and the interstage tuning circuit is located between the high frequency amplifier and the mixer.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
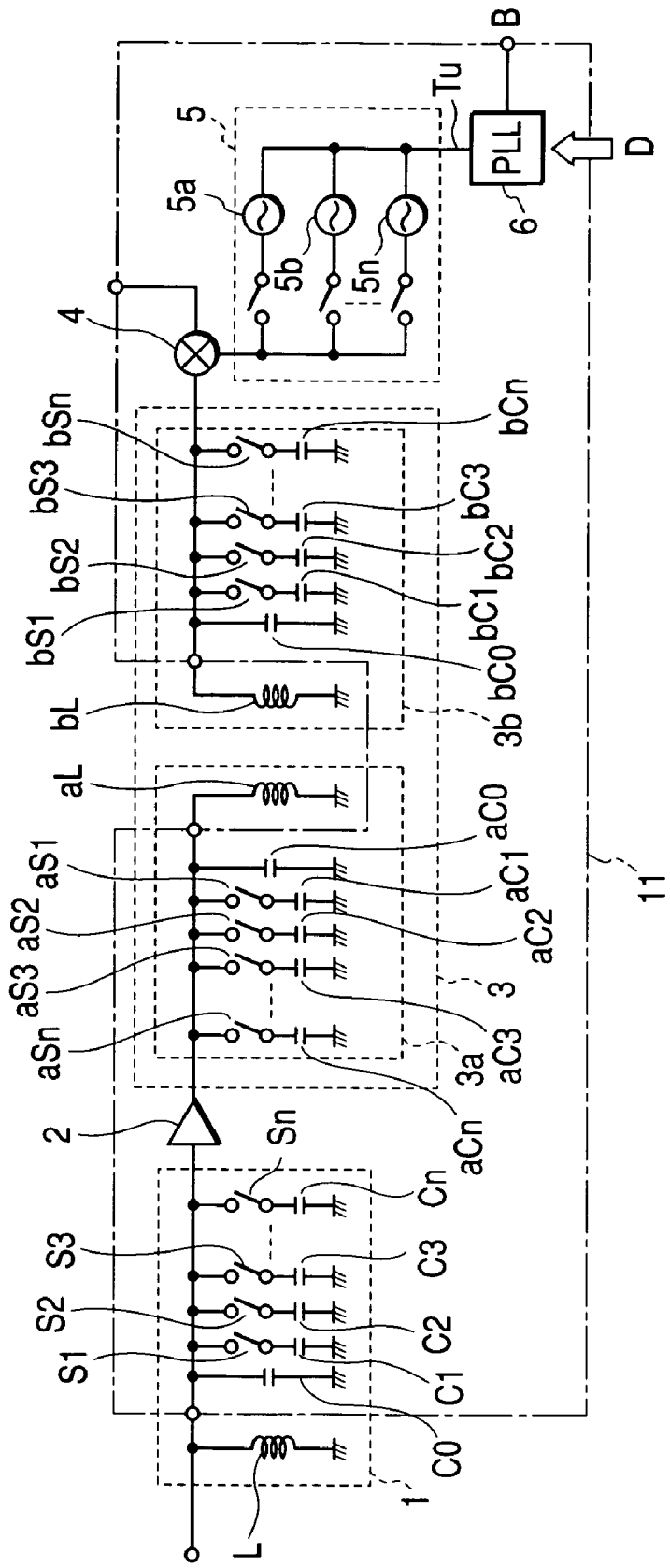
FIG. 1 is a circuit diagram showing the structure of a television tuner according to the present invention.

Next, the television tuner according to the present invention will be described referring to FIG. 1. First, a television signal enters an input tuning circuit 1. The input tuning circuit 1 has an inductor L and plural capacitors C0, C1, C2, C3 and so on up to Cn. All the elements of the input tuning circuit 1 except the inductor L, namely the capacitors C0 to Cn, are included in an integrated circuit 11. The inductor L is connected between terminal 11a of the integrated circuit 11 and the ground, and located outside the integrated circuit 11. The first capacitor C0 is connected in parallel with the inductor L through the terminal 11a. The other second capacitors C1 to Cn are respectively connected with the inductor L through serially connected switches S1 to Sn. The switches S1 to Sn are also included in the integrated circuit 11. A television signal goes through the terminal 11a to enter the circuit.

The stage next to the input tuning circuit 1 is a high frequency amplifier 2, next to which is an interstage tuning circuit 3. The high frequency amplifier 2 is included in the integrated circuit 11. The interstage tuning circuit 3 is a double tuning circuit. It has a primary tuning circuit 3a and a secondary tuning circuit 3b which are structurally identical. The primary tuning circuit 3a has an inductor aL and plural capacitors aC0, aC1, aC2, aC3 and so on up to aCn which are connected in parallel with the inductor aL. All the elements of the primary tuning circuit 3a except the inductor aL, namely capacitors aC0 to aCn, are included in the integrated circuit 11. The inductor aL is connected between terminal 11b of the integrated circuit 11 and the ground, and located outside the integrated circuit 11. The first capacitor aC0 is connected in parallel with the inductor aL through the terminal 11b. The other capacitors aC1 to aCn are respectively connected with the inductor aL through serially connected switches aS1 to aSn. The switches aS1 to aSn are also included in the integrated circuit 11.

The secondary tuning circuit 3b has an inductor bL and plural capacitors bC0, bC1, bC2, bC3 and so on up to bCn which are connected in parallel with the inductor bL. All the elements of the secondary tuning circuit 3b except the inductor bL, namely capacitors bC0 to bCn, are included in the integrated circuit 11. The inductor bL is connected between terminal 11c of the integrated circuit 11 and the ground, and located outside the integrated circuit 11, and inductively coupled with the inductor aL of the primary tuning circuit 3a. Hence, the coupling of the primary tuning circuit 3a and the secondary tuning circuit 3b can be adjusted. The first capacitor bC0 is connected in parallel with the inductor bL through the terminal 11c. The other capacitors bC1 to bCn are respectively connected with the inductor bL through serially connected switches bS1 to bSn. The switches bS1 to bSn are also included in the integrated circuit 11.

In the above configuration, the switches S1 to Sn in the input tuning circuit 1, the switches aS1 to aSn in the primary tuning circuit 3a of the interstage tuning circuit 3 and the switches bS1 to bSn in its secondary tuning circuit 3b are opened or closed according to a channel selection signal sent from a television receiver (not shown). Here, three switches which are associated with each other (for example, S1, aS1 and bS1) operate in conjunction with each other; in other words, when one of them is open (closed), the other switches are also open (closed). Therefore, for each of the inductors L, aL, and bL, there are 2n kinds of inductor-capacitor combinations. When the respective inductors in the input tuning circuit 1, primary tuning circuit 3a, and secondary tuning circuit 3b, namely L, aL, and bL, have the same inductance value and mutually associated capacitors (for example, C0, aC0, bC0) have the same capacitance value, all these tuning circuits have the same tuning frequency.

Taking the input tuning circuit 1 as an example, the relation among the capacitors C0 to Cn in terms of capacitance is explained below. The same relation applies to the interstage tuning circuit 3 (primary tuning circuit 3a and secondary tuning circuit 3b). The explanation given here assumes that the capacitance values of the capacitors C0 to Cn are respectively expressed by c0 to cn and n is 3.

Figures 2, 3:
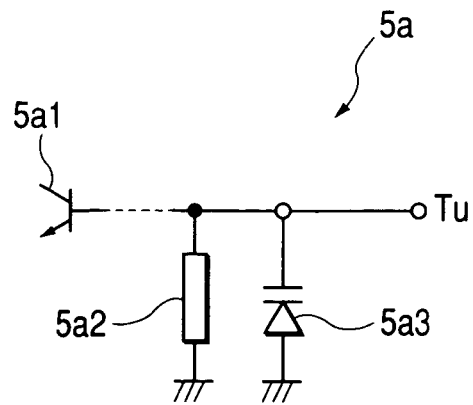
FIG. 2 is a table showing the relation between circuit element connection states and tuning frequencies in the television tuner according to the present invention.
FIG. 3 is a circuit diagram showing an oscillator which is used in the television tuner according to the present invention.
Figure 4:
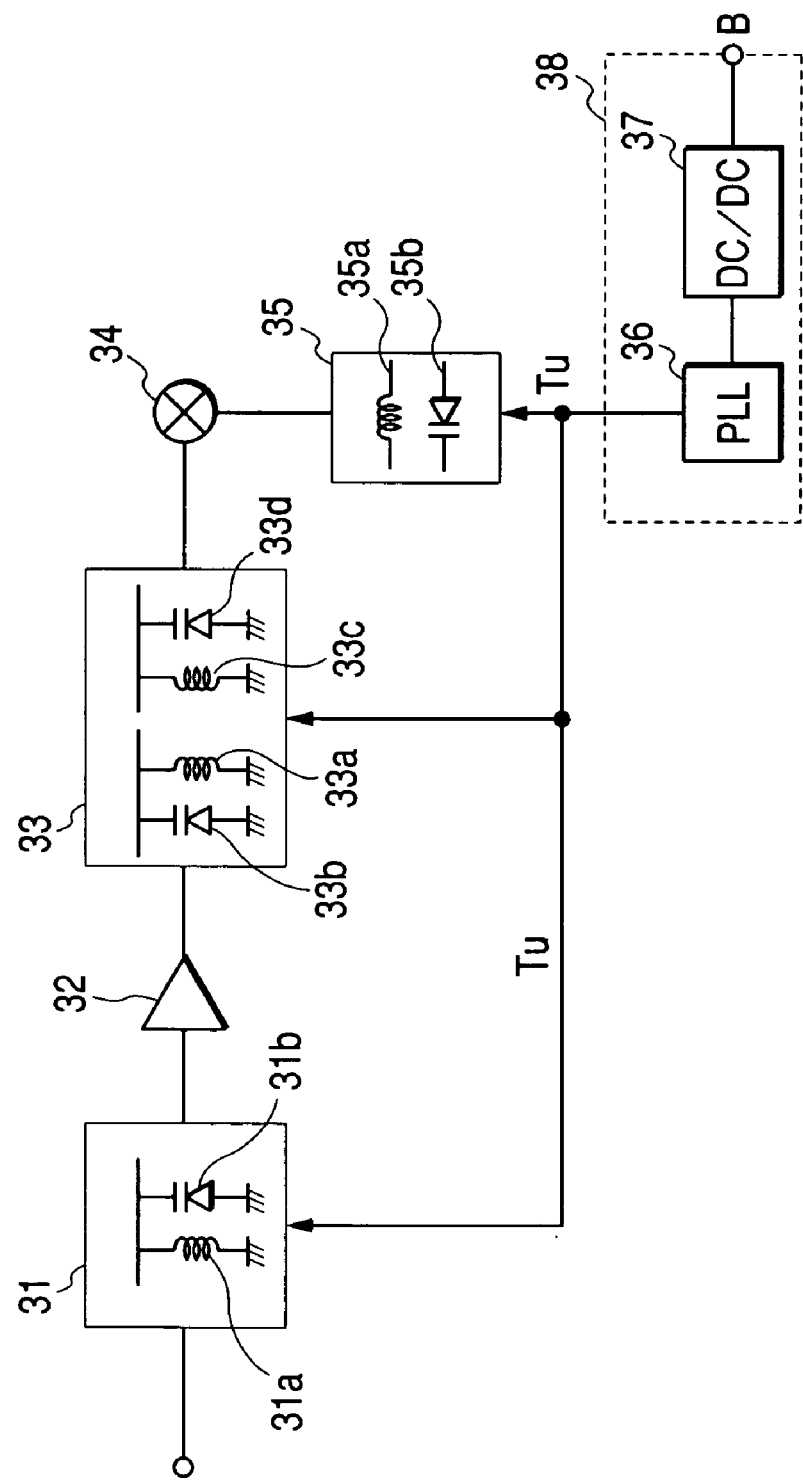
FIG. 4 is a circuit diagram showing the structure of a conventional television tuner.

The first point to be noted is as follows. FIG. 2 is a table showing different cases of connection between the inductor L and the capacitors C0 to C3. In FIG. 2, 0 represents "not connected" while 1 represents "connected." The primary capacitor C0 is always connected with the inductor L. f0 to f7 represent the tuning frequency available for each case of connection. Here, when the inductor L is connected only with the primary capacitor C0, the tuning frequency (f0) is set so as to correspond to a channel for the highest frequency in the receiving frequency band.

The second point to be noted is that the frequency interval between television channels is constant ($\Delta f=6$ MHz) Therefore, the following relation holds: $\Delta f=f0-f1=f1-f2=f2-f3=f3-f4=f4-f5=f5-f6=f6-f7=f7-f8$. The capacitance value c1 of the first one C1 of the secondary capacitors C1 to Cn is expressed as follows:

$$C1 = 2c0 \times \Delta f / f0$$

Using an approximate expression, the capacitance values of the second capacitor C2 and the third capacitor C3 are respectively calculated as follows:

$$C2 = 2 \times c1, \; c3 = 2 \times c2 = 2 \times 2 \times c1$$

This relation can be expressed by the following general expression:

$$cn = 2^{N-1} \times c1$$

Here, even when n is larger than 3, this relation holds in terms of capacitance. When the capacitance values are set according to the above relation, rough tuning to the television frequency of a desired channel (channel through which a signal is to be received) is possible. For example, if n is 6, tuning to television signals from 64 channels is possible.

Next to the interstage tuning circuit 3 is a mixer 4. The mixer 4 is also included in the integrated circuit 11. The output terminal of the mixer 4 is connected with a terminal 11d in the integrated circuit 11. The terminal 11d is connected with an intermediate frequency tuning circuit (not shown) or the like which is located outside the integrated circuit 11.

An oscillating section 5 which supplies a local oscillation signal to the mixer 4 has plural oscillators 5a, 5b and so on up to 5m (m<n) and is included in the integrated circuit 11. The oscillators 5a to 5m are each independent. As one of them is selected, it supplies a local oscillation signal. The oscillators 5a to 5m are structurally identical. For example, the oscillator 5a is a resonant circuit which has an oscillating element 5a1, an inductor 5a2, and a variable capacitor 5a3, as illustrated in FIG. 3. Tuning voltage TU is applied to the variable capacitor 5a3. What is different among the oscillators 5a to 5m is that the inductors 5a2 to 5m2 have different inductance values. The inductors 5a2 to 5m2 may be, for example, spiral conductor lines formed on an insulating layer in the integrated circuit 11 (here referred to as planar spiral inductors).

The variable capacitors 5a3 to 5m3 may be, for example, FETs (field effect transistors) in which the drain and the source are connected and a capacitance generated between the source/drain and gate terminals is employed. If the voltage between terminals varies from 0 V to 3 V, a variable capacitor whose capacitance value varies from 0.3 pF (picofarads) to 0.5 pF (in this case, the rate of variation is approx. 70%) is realized. Therefore, even if low tuning voltage is applied to the variable capacitors 5a3 to 5m3, a frequency variation rate of approx. 30% can be achieved.

If the channel frequencies for receiving signals are as low as 100 MHz or less, one oscillator can generate local oscillation frequencies for a group of two or three channels; if the channel frequencies are around 200 MHz, one oscillator can generate local oscillation frequencies for a group of four or five channels. In the case of ultra-high frequency television signals, more channels can be covered.

Tuning voltage TU to be applied to the variable capacitors 5a3 to 5m3 is outputted from the PLL circuit 6. Although the PLL circuit 6 is included in the integrated circuit 11, output tuning voltage TU is determined according to channel selection signal D which is sent to the PLL circuit 6 on the basis of supply voltage (3 V to 5 V) applied to the integrated circuit 11.

As discussed so far, according to the present invention, a tuning circuit has an inductor and plural capacitors and at least one of the capacitors is selected and connected in parallel with the inductor; the oscillating section has at least plural oscillators which are included in an integrated circuit; in the integrated circuit, each of the oscillators has a variable capacitor to vary the frequency of the local oscillation signal and groups into which the receiving frequency band is divided correspond to the oscillators on the basis of one oscillator per group; and each of the oscillators generates local oscillation frequencies depending on television signals in the corresponding group. Therefore, the tuning circuit no longer requires tuning voltage to vary the tuning frequency and also the tuning voltage to be applied to the oscillators may be lowered, thereby eliminating the need for a DC-DC converter. As a consequence, the television tuner can be structurally simplified.

Furthermore, the integrated circuit includes plural capacitors and switches to select the capacitors; the inductor is located outside the integrated circuit; and the integrated circuit has a terminal to connect the inductor with the capacitors. Therefore, when a double tuning circuit is used, the coupling of two tuning circuits can be adjusted.

The capacitors comprise a primary capacitor connected with the inductor and plural secondary capacitors which are selected by switches and connected with the inductor. Therefore, a tuning frequency can be set easily by controlling the opening/closing of the switches.

The capacitance value of each of the second to Nth ones of the secondary capacitors is (2N−1) times as large as the capacitance value of the first one of the secondary capacitors. Therefore, tuning to television signals whose frequencies are equally spaced is possible.

Since the high frequency amplifier and the mixer are included in the integrated circuit, the television tuner can be structurally simplified.

Also, the tuning circuit comprises an input tuning circuit and an interstage tuning circuit; the input tuning circuit is located before the high frequency amplifier; and the interstage tuning circuit is located between the high frequency amplifier and the mixer. Therefore, it is possible to realize a standard television tuner using an integrated circuit.

What is claimed is:

1. A television tuner comprising:
   a tuning circuit which tunes with a television signal within a prescribed receiving frequency band;
   a high frequency amplifier which amplifies the television signal;
   a mixer which converts the television signal into an intermediate frequency signal; and
   an oscillating section which supplies a local oscillation signal to the mixer, wherein
   the tuning circuit is made up of an inductor and plural capacitors;
   wherein at least one of the capacitors is selected and connected in parallel with the inductor;
   wherein the oscillating section is made up of at least plural oscillators which are included in an integrated circuit;
   wherein in the integrated circuit, each of the oscillators has a variable capacitor to vary a frequency of the local oscillation signal;
   wherein groups into which the receiving frequency band is divided correspond to the oscillators on the basis of one oscillator per group; and
   wherein each of the oscillators generates local oscillation frequencies depending on television signals in the corresponding group.

2. The television tuner according to claim 1, wherein
   the integrated circuit includes the plural capacitors and switches to select the capacitors;
   wherein the inductor is located outside the integrated circuit; and
   wherein the integrated circuit has a terminal to connect the inductor with the capacitors.

3. The television tuner according to claim 2, wherein the capacitors comprises a primary capacitor connected with the inductor and plural secondary capacitors which are selected by the switches and connected with the inductor.

4. The television tuner according to claim 3, wherein a capacitance value of each of a second to Nth ones of the secondary capacitors is (2N−1) times as large as a capacitance value of a first one of the secondary capacitors.

5. The television tuner according to claim 2, wherein the high frequency amplifier and the mixer are included in the integrated circuit.

6. The television tuner according to claim 1, wherein
   the tuning circuit comprises an input tuning circuit and an interstage tuning circuit;
   wherein the input tuning circuit is located before the high frequency amplifier; and
   wherein the interstage tuning circuit is located between the high frequency amplifier and the mixer.

* * * * *